(12) United States Patent
Harutyunyan

(10) Patent No.: US 11,041,236 B2
(45) Date of Patent: Jun. 22, 2021

(54) METHOD FOR DIRECT PATTERNED GROWTH OF ATOMIC LAYER METAL DICHALCOGENIDES WITH PRE-DEFINED WIDTH

(71) Applicant: HONDA MOTOR CO., LTD., Tokyo (JP)

(72) Inventor: Avetik Harutyunyan, Columbus, OH (US)

(73) Assignee: HONDA MOTOR CO., LTD., Tokyo (JP)

( * ) Notice: Subject to any disclaimer, the term of this patent is extended or adjusted under 35 U.S.C. 154(b) by 57 days.

(21) Appl. No.: 16/290,407

(22) Filed: Mar. 1, 2019

(65) Prior Publication Data

US 2020/0277699 A1 Sep. 3, 2020

(51) Int. Cl.
*C23C 16/04* (2006.01)
*H01L 21/02* (2006.01)
*C23C 16/30* (2006.01)

(52) U.S. Cl.
CPC ............ *C23C 16/04* (2013.01); *C23C 16/042* (2013.01); *C23C 16/30* (2013.01);
(Continued)

(58) Field of Classification Search
CPC ....... C23C 16/04; C23C 16/042; C23C 16/30; C23C 16/305; C23C 16/45525
See application file for complete search history.

(56) References Cited

U.S. PATENT DOCUMENTS 10,825,911 B1* 11/2020 Engel ............... H01L 29/401
2007/0139756 A1* 6/2007 Agrawal ........... G02F 1/15165
359/265
(Continued)

FOREIGN PATENT DOCUMENTS

JP 2018123039 A 8/2018

OTHER PUBLICATIONS

Kim, Youngjun, et al., "Self-Limiting Layer Synthesis of Transition Metal Dichalcogenides". Scientific Reports, 6:18754, Jan. 4, 2016, pp. 1-8. DOI: 10.1038/srep 18754.*
(Continued)

*Primary Examiner* — Bret P Chen
(74) *Attorney, Agent, or Firm* — Arent Fox LLP

(57) ABSTRACT

A method of growing patterns of an atomic layer of metal dichalcogenides, the method including providing a substrate, providing aligned patterns of carbon nanostructures on the substrate, providing a first metal portion in contact with a first portion of the patterns of carbon nanostructures and a second metal portion in contact with a second portion of the patterns of carbon nanostructures, depositing a salt layer on the substrate and the patterns of carbon nanostructures, resistively heating the patterns of carbon nanostructures to remove the patterns of carbon nanostructures and salt deposited thereon from the substrate, wherein removing the patterns of carbon nanostructures and salt deposited thereon from the substrate provides salt patterns on the substrate, and growing an atomic layer of metal dichalcogenides on the salt patterns, wherein the atomic layer of metal dichalcogenides is provided in aligned patterns each having a pre-defined width. Also disclosed are patterns of an atomic layer of metal dichalcogenides prepared according to the method of the disclosure.

20 Claims, 7 Drawing Sheets

(52) U.S. Cl.
CPC .... *H01L 21/0262* (2013.01); *H01L 21/02422* (2013.01); *H01L 21/02568* (2013.01); *H01L 21/02603* (2013.01); *H01L 21/02639* (2013.01)

(56) References Cited

U.S. PATENT DOCUMENTS

| | | | |
|---|---|---|---|
| 2007/0224084 A1* | 9/2007 | Holmes | A61B 5/150221 422/68.1 |
| 2009/0215276 A1* | 8/2009 | Vereecken | H01G 9/2045 438/758 |
| 2012/0174856 A1 | 7/2012 | Wei et al. | |
| 2016/0016796 A1* | 1/2016 | Hersam | C01B 32/194 423/290 |
| 2016/0149146 A1 | 5/2016 | Zou et al. | |
| 2017/0250075 A1* | 8/2017 | Caymax | H01L 21/02658 |
| 2017/0373311 A1* | 12/2017 | Salehi-Khojin | H01M 10/0569 |
| 2018/0358596 A1* | 12/2018 | Woo | H01M 4/628 |
| 2019/0074180 A1* | 3/2019 | Park | H01L 29/78696 |
| 2019/0109002 A1* | 4/2019 | Mattinen | H01L 29/78681 |
| 2019/0371605 A1* | 12/2019 | Li | C23C 16/4488 |
| 2019/0382893 A1* | 12/2019 | Mane | C23C 16/45527 |
| 2020/0274010 A1* | 8/2020 | Yeom | H01L 31/0324 |
| 2020/0277700 A1* | 9/2020 | Park | H01L 21/0262 |

OTHER PUBLICATIONS

Liu, Hongfei, "Recent Progress in Atomic Layer Deposition of Multifunctional Oxides and Two-Dimensional Transition Metal Dichalcogenides". Journal of Molecular and Engineering Materials, vol. 04, No. 04, 1640010 (2016), one page. Abstract Only.*

Hao, W., et al., "Atomic layer deposition of stable 2D materials". 2D Materials, IOP Publishing, 2019, 6 (1), p. 012001-012076. 10.1088/2053-1583/aad94fff. ffhal-02063825f.*

Bosi, Matteo, "Growth and synthesis of mono and few-layers transition metal dichalcogenides by vapour techniques: a review". RSC Advances, 2015, 5, 75500-75518.*

Lin, Dongjing, et al., "Patterns and driving forces of dimensionality-dependent charge density waves in 2H-type transition metal dichalcogenides". Nature Communications, (2020) 11:2406, pp. 1-9.*

Choi, Wonbong, et al., "Recent development of two-dimensional transition metal dichalcogenides and their applications". Materials Today, vol. 20, No. 3, Apr. 2017, pp. 1-15.*

Chen, Jianyi, et al., "Homoepitaxial Growth of Large-Scale Highly Organized Transition Metal Dichalcogenide Patterns". Adv. Mater. 2018, 30, 1704674, pp. 1-9.*

Yang, Hui Ying, et al., "Carbon nanotube membranes with ultrahigh specific adsorption capacity for water desalination and purification". Nature Communications, 4:2220, 2013, pp. 1-8. DOI: 10.1038/ncomms3220.*

Ellahi, Rahmat, et al., "Study of Natural Convection MHD Nanofluid by Means of Single and Multi-Walled Carbon Nanotubes Suspended in a Salt-Water Solution". IEEE Transactions On Nanotechnology, vol. 14, No. 4, Jul. 2015, pp. 726-734.*

Ugarte, D., et al., "Filling carbon nanotubes". Appl. Phys. A 67, 101-106 (1998).*

Thomas, Michael, et al., "A computational assessment of the permeability and salt rejection of carbon nanotube membranes and their application to water desalination". Philosophical Transactions A, 374: 20150020, pp. 1-20, http://dx.doi.org/10.1098/rsta.2015.0020.*

Notice of Reasons for Rejection issued by the Japanese Patent Office corresponding to Japanese Patent Application No. 2020-023462, dated Nov. 17, 2020.

Wang, Z. et al. "NaCl-assisted one-step growth of Mos2-WS2 -n-plane heterostructures", Nanotechnology 28, pp. 1-10, (2017).

* cited by examiner

METHOD FOR DIRECT PATTERNED GROWTH OF ATOMIC LAYER METAL DICHALCOGENIDES WITH PRE-DEFINED WIDTH

TECHNICAL FIELD

The present disclosure is directed generally to a method of growing patterns of an atomic layer of metal dichalcogenides.

BACKGROUND

Given Moore's Law of Industry (that is, that the number of transistors in a dense integrated circuit doubles about every two years), it is imperative to continue scaling electronics to meet ongoing demands. However, commonly exploited lithography processes are limited by mask resolution issues (generally about 10-15 nm) and/or required post synthesis processing (e.g., coatings with various substances and transferring to other substrates), which inevitably leads to the contamination of monolayers and their intrinsic properties.

Recently, atomic layers of metal dichalcogenides have become the subject of intense investigation due to their promising optoelectronic and catalytic properties, particularly in the context of new generation circuits. However, there is currently no reliable method for preparing monolayer ribbons having widths on the low nanoscale, which may be desirable for current demands.

SUMMARY

The present disclosure is directed to a method of growing patterns of an atomic layer of metal dichalcogenides, particularly transition metal dichalcogenides, having a pre-defined width, and in particular, a sub-five nanometer width. The method may comprise the steps of providing a substrate; providing aligned patterns of carbon nanostructures on the substrate; providing a metal in contact with at least two separate portions of the patterns of carbon nanostructures; depositing a salt layer on the substrate and the patterns of carbon nanostructures; resistively heating the patterns of carbon nanostructures to remove the patterns of carbon nanostructures and the salt deposited thereon, wherein removing the patterns of carbon nanostructures and the salt deposited thereon provides salt patterns corresponding to the remaining salt layer; and growing an atomic layer of metal dichalcogenides on the salt patterns, wherein the atomic layer of metal dichalcogenides is provided in aligned patterns having a pre-defined width. The present disclosure is also directed to the patterns of metal dichalcogenides provided by the method as described herein and methods of using the same.

DETAILED DESCRIPTION

The present disclosure is directed to a method of growing patterns of an atomic layer of metal dichalcogenides, particularly transition metal dichalcogenides, having a pre-defined width, and in particular, a sub-five nanometer width. The method may comprise the steps of providing a substrate; providing aligned patterns of carbon nanostructures on the substrate; providing a metal in contact with at least two separate portions of the patterns of carbon nanostructures; depositing a salt layer on the substrate and the patterns of carbon nanostructures; resistively heating the patterns of carbon nanostructures to remove the patterns of carbon nanostructures and the salt deposited thereon, wherein removing the patterns of carbon nanostructures and the salt deposited thereon provides salt patterns corresponding to the remaining salt layer; and growing an atomic layer of metal dichalcogenides on the salt patterns, wherein the atomic layer of metal dichalcogenides is provided in aligned patterns having a pre-defined width. The present disclosure is also directed to the patterns of metal dichalcogenides provided by the method as described herein and methods of using the same.

The method may comprise providing a substrate. According to some aspects, the substrate may be any inert material suitable for use according to the methods as described herein. Examples of substrates useful according to the present disclosure include, but are not limited to, substrates comprising or consisting of $SiO_2$, Si, c-sapphire, fluorophlogopite mica, $SrTiO_3$, h-BN, or combinations thereof. It should be understood that where a $SiO_2$ substrate is described herein as an example substrate, any suitable substrate may be used in addition to or instead of the same.

Figure 1:
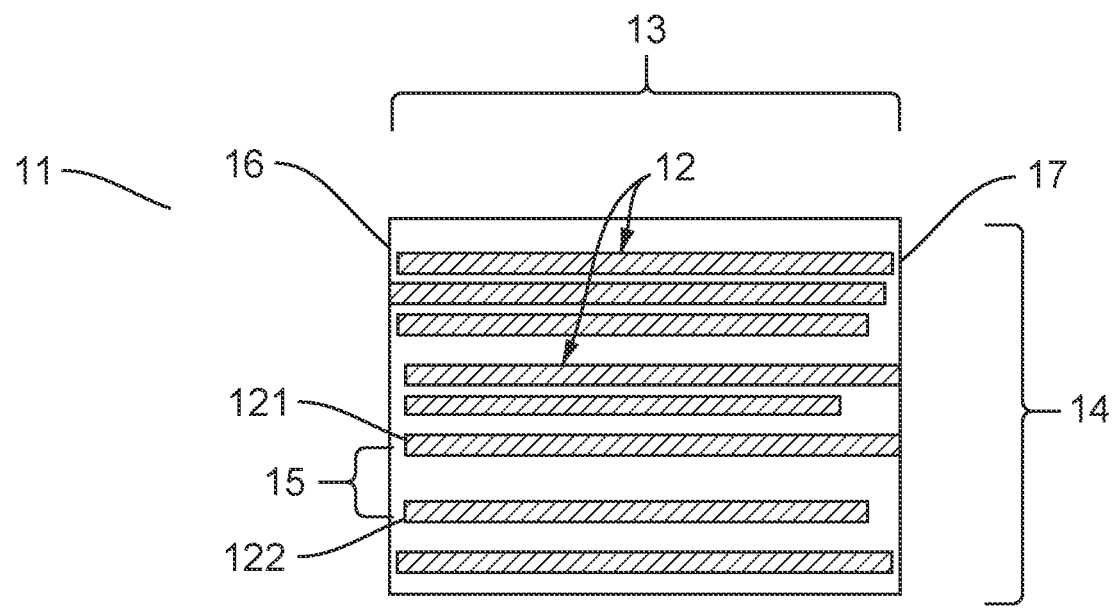
FIG. 1 shows an example substrate having aligned strips of carbon nanostructures deposited thereon, according to aspects of the present disclosure.

The method may comprise providing aligned patterns of carbon nanostructures on the substrate. As used herein, the term "pattern" refers to a configured shape of a material. According to some aspects, the aligned patterns of carbon nanostructures may comprise aligned "strips" of carbon nanostructures, alternatively referred to herein as "bands" or "ribbons." As used herein, the term "aligned" refers to an alignment wherein two or more patterns are oriented to provide an approximately constant distance therebetween. For example, FIG. 1 shows a substrate 11, such as an $SiO_2$ substrate, having aligned strips of carbon nanostructures 12 deposited thereon. According to some aspects, the aligned strips of carbon nanostructures 12 may be provided so as to extend from about a first end 16 of the substrate 11 to about a second end 17 of the substrate 11. As shown in FIG. 1, a first strip 121 of the aligned strips of carbon nanostructures 12 is aligned with a second strip 122 of the aligned strips, such that a distance 15 between the first strip 121 and the second strip 122 is approximately constant along the length 13 of the substrate. According to some aspects, the patterns may be horizontally aligned. It should be understood that the term "horizontal" in the context of the present disclosure, and in particular, in the context of FIG. 1, merely refers to the length 13 of the substrate, that is, the dimension that is greater than the width 14 of the substrate. However, the terms "horizontal," "vertical," "length," and "width" should not necessarily limit the orientation of the patterns of carbon nanostructures and/or the substrate in space. It should also be understood that while the figures herein show an example substrate having a rectangular shape with a length 13 that is greater than the width 14, the substrate may have any shape acceptable for use with the methods as described herein, including, but not limited to, a polygonal shape (triangular, square, pentagonal, hexagonal, etc.), an elliptic shape (circular, oval-shaped, etc.), and combinations thereof.

As used herein, the term "nanostructure" refers to a structure having at least one dimension on the nanoscale, that is, at least on dimension between about 0.1 and 100 nm. It should be understood that "nanostructures" include, but are not limited to, nanosheets, nanotubes, nanoparticles (e.g., polyhedral nanoparticles), nanopsheres, nanowires, nanocubes, and combinations thereof. A nanosheet may comprise a sheet having a thickness on the nanoscale. A nanotube may comprise a tube having a diameter on the nanoscale. A nanoparticle may comprise a particle wherein each spatial dimension thereof is on the nanoscale. According to some aspects, the carbon nanostructures may comprise copper nanotubes, including, but not limited to, single-walled nanotubes (SWNTs), multi-walled nanotubes (MWNTs), and combinations thereof. The SWNTs and/or MWNTs may have a dimeter that is between about 0.1 and 100 nm, optionally between about 0.1 and 50 nm, optionally between about 0.1 and 25 nm, optionally between about 0.1 and 10 nm, optionally between about 0.1 and 5 nm, and optionally about 1 nm. It should be understood that aligned patterns of carbon nanostructures may be provided on the substrate by any means known in the art compatible with the present disclosure, including, but not limited to, chemical vapor deposition (CVD). For example, the aligned patterns of carbon nanostructures may be provided on the substrate by providing a colloidal dispersion of catalyst particles on the substrate and growing carbon nanostructures thereon by CVD and/or by providing a colloidal dispersion of catalyst precursor particles on the substrate, heating the catalyst precursor particles to form catalyst particles, and growing carbon nanostructures thereon by CVD.

Figure 6A:
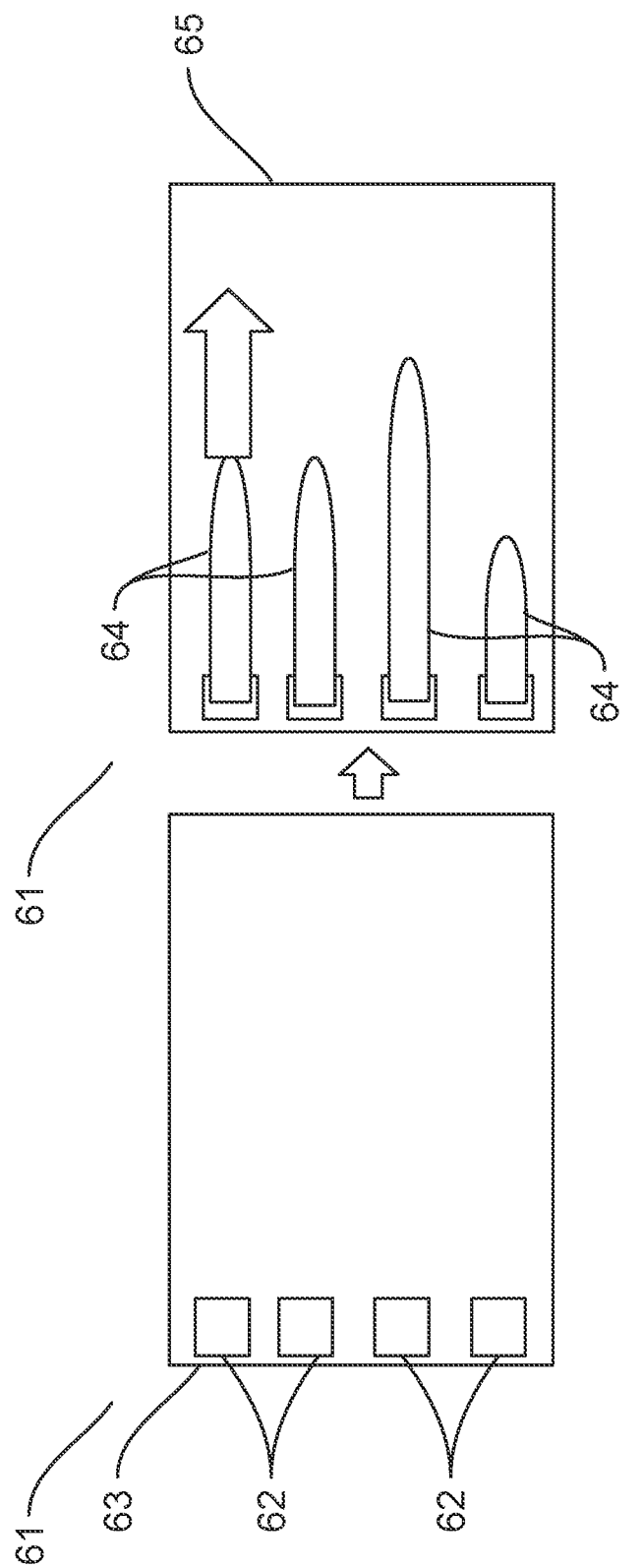
FIG. 6A shows an example method of growing aligned patterns of carbon nanostructures, according to aspects of the present disclosure.

FIG. 6A shows an example method of growing aligned patterns of carbon nanostructures as described herein. In particular, FIG. 6A shows a substrate 61 having catalyst particles 62 provided near a first end 63 thereof. In this example, a carbon source gas may be provided, optionally with a carrier gas such as an inert gas. The carbon source and/or inert gas may be provided at a sufficient flow rate such that growth of carbon nanostructures 64 proceeds in a selected direction, for example, toward a second end 65 of the substrate 61. Examples of sufficient flow rates include, but are not limited to, at least 1000 sccm, optionally at least 2000 sccm, and optionally at least 3000 sccm. In this way, aligned patterns of carbon nanostructures 64 may be provided, the patterns extending from a first end 63 of the substrate 61 to a second end 65 of the substrate 61. It should be understood that upon each catalyst particle 62, one nanostructure may grow. Alternatively, upon each catalyst particle 62, two or more nanostructures may grow.

Figure 6B:
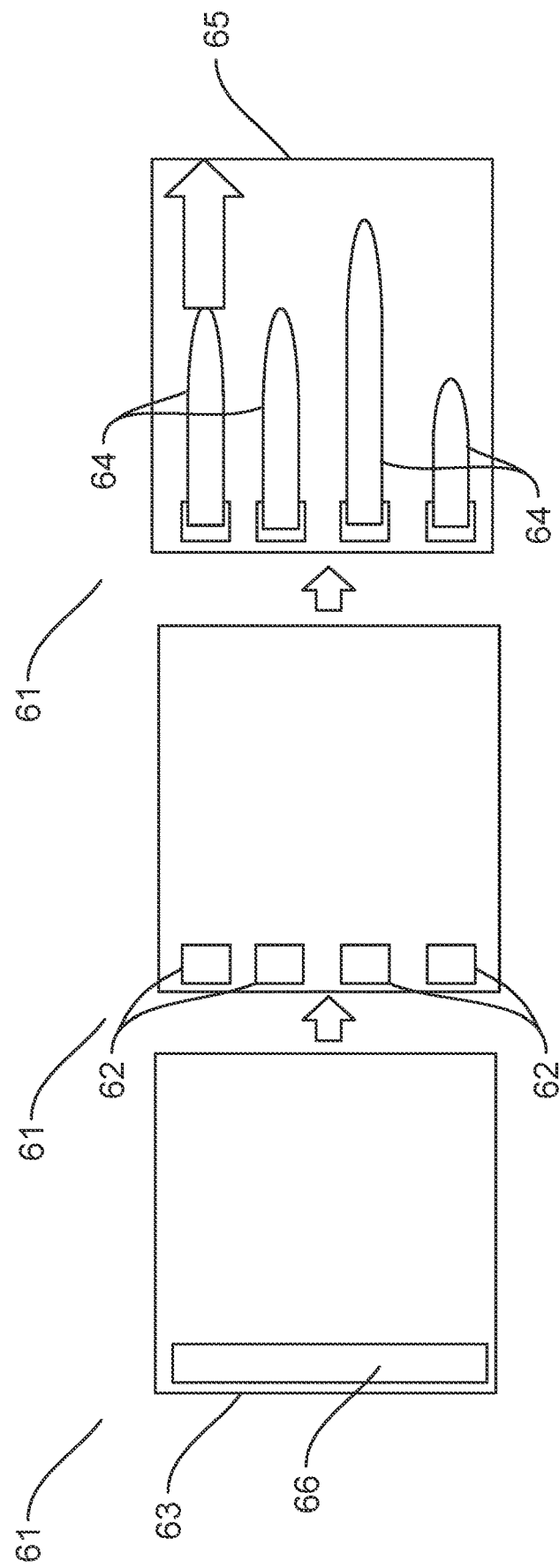
FIG. 6B shows an example method of growing aligned patterns of carbon nanostructures, according to aspects of the present disclosure.

FIG. 6B shows another example method of growing aligned patterns of carbon nanostructures as described herein. Similar to the example shown in FIG. 6A, the example shown in FIG. 6B may comprise providing a catalyst 66 near a first end 63 of a substrate 61. As shown in FIG. 6B, the catalyst 66 may comprise a thin film strip of catalyst material, e.g., a film having a thickness of between about 5 and 20 nm. The thin film strip of catalyst material 66 may then be subjected to a thermal treatment in an inert environment in order to provide discrete catalyst particles 62, similar to the catalyst particles 62 shown in FIG. 6A. The method may then proceed as described in relation to FIG. 6A, that is, a carbon source gas and optionally a carrier gas may be provided at a sufficient flow rate such that growth of carbon nanostructures 64 proceeds in a selected direction, for example, toward a second end 65 of the substrate.

According to some aspects, a mask may be used to provide the thin film strip of catalyst material on the substrate as described herein. In this example, the mask may be removed and the thin film strip of catalyst material may be subjected to a thermal treatment as described herein to provide catalyst particles. Additionally or alternatively, a lithography process may be used to provide the thin film strip of catalyst material and/or the catalyst particles on the substrate.

Examples of carbon sources useful according to the present disclosure include, but are not limited to, a hydrocarbon, an alcohol, an ester, a ketone, an aromatic, an aldehyde, and a combination thereof. For example, the carbon source may be selected from xylene, propane, butane, butene, ethylene, ethanol, carbon monoxide, butadiene, pentane, pentene, methane, ethane, acetylene, carbon dioxide, naphthalene, hexane, cyclohexane, benzene, methanol, propanol, propylene, commercial fuel gases (such as liquefied petroleum gas, natural gas, and the like), and combinations thereof.

Examples of inert gases useful according to the present disclosure include, but are not limited to, gases comprising helium (He), radon (Rd), neon (Ne), argon (Ar), xenon (Xe), nitrogen (N), and combinations thereof.

The catalyst material as described herein may be any catalyst known in the art compatible with use according to the present disclosure, including materials containing Fe, Ni, Co, Mo, Cu, Pt, Pd, Ru, Au, Ag, W and alloys thereof.

The method may comprise providing a metal in contact with at least two separate portions of the patterns of carbon nanostructures. According to some aspects, the metal may be provided using a mask (e.g., a mask that exposes only the at least two separate portions of the patterns of carbon nanostructures) and/or a lithography process. The metal according to the present disclosure may comprise a metal capable of forming an electrical network with at least a voltage source and the carbon nanostructures, as described herein. Examples of metals useful according to the present disclosure include, but are not limited to, nickel (Ni), titanium (Ti), copper (Cu), gold (Au), and combinations thereof.

Figure 2:
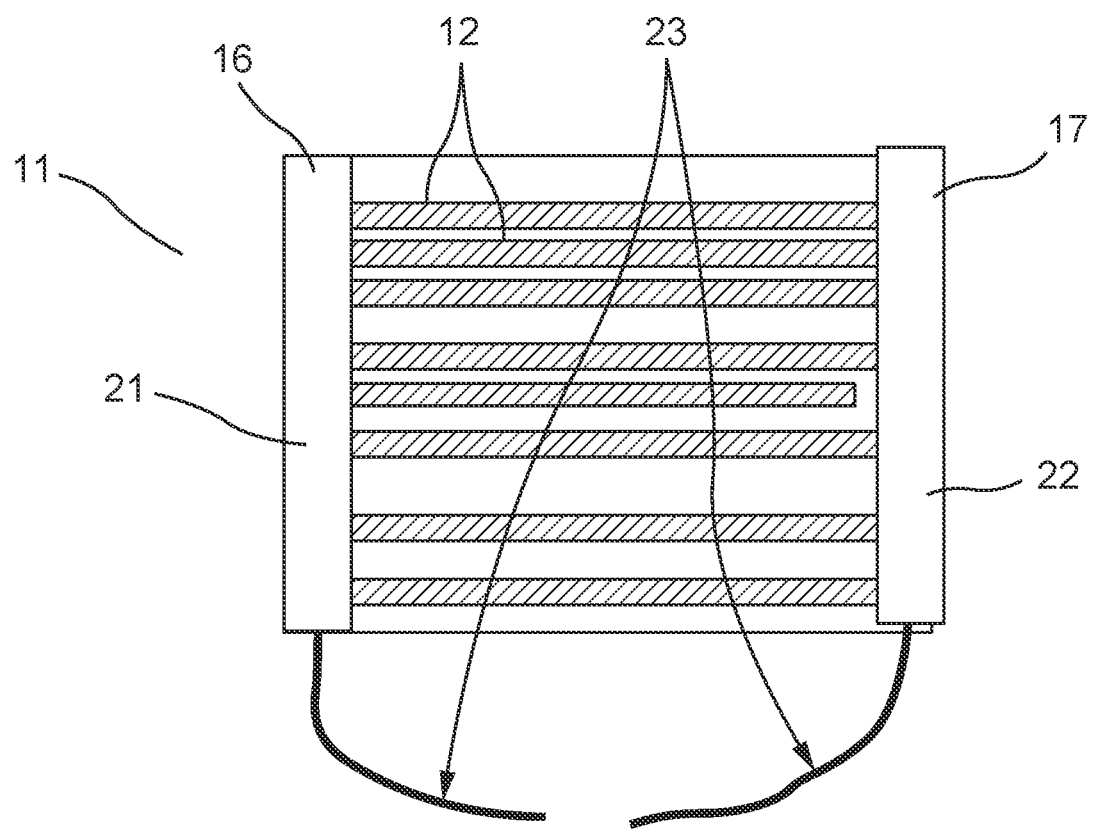
FIG. 2 shows an example of a metal provided in contact with at least two separate portions of patterns of carbon nanostructures, according to aspects of the present disclosure.

FIG. 2 shows an example of a metal provided in contact with at least two separate portions of the patterns of carbon nanostructures. In particular, FIG. 2 shows a substrate 11 having aligned strips of carbon nanostructures 12 deposited thereon, as described in relation to FIG. 1. FIG. 2 further shows a first metal portion 21 and a second metal portion 22 separate from each other. As shown in FIG. 2, both the first metal portion 21 and the second metal portion 22 are in contact with the aligned strips of carbon nanostructures 12, for example, at or near the first end 16 and the second end 17 of the substrate 11, respectively. It should be understood that the first metal portion 21 and the second metal portion 22 may comprise the same or different metals, so long as they both comprise at least one metal as described herein. One or both of the first metal portion 21 and the second metal portion 22 may further be provided with wiring 23 that is capable of forming an electrical network with a voltage source, the metal portions, and the carbon nanostructures, as described herein. The wiring may comprise a metal as described herein, which may be the same as or different from the metal(s) comprised by the first metal portion 21 and/or the second metal portion 22.

The method may comprise depositing a salt on the substrate and the patterns of carbon nanostructures. As used herein, the term "salt" refers to an electrically neutral ionic compound having cation(s) and anion(s). Examples of salts usefulness according to the present disclosure include, but are not limited to, sodium salts and potassium salts, such as NaBr, NaCl, KBr, KCl, and combinations thereof. It should be understood that while NaBr is used herein as an example salt, any suitable salt may be used in addition to or instead of the same.

Figure 3:
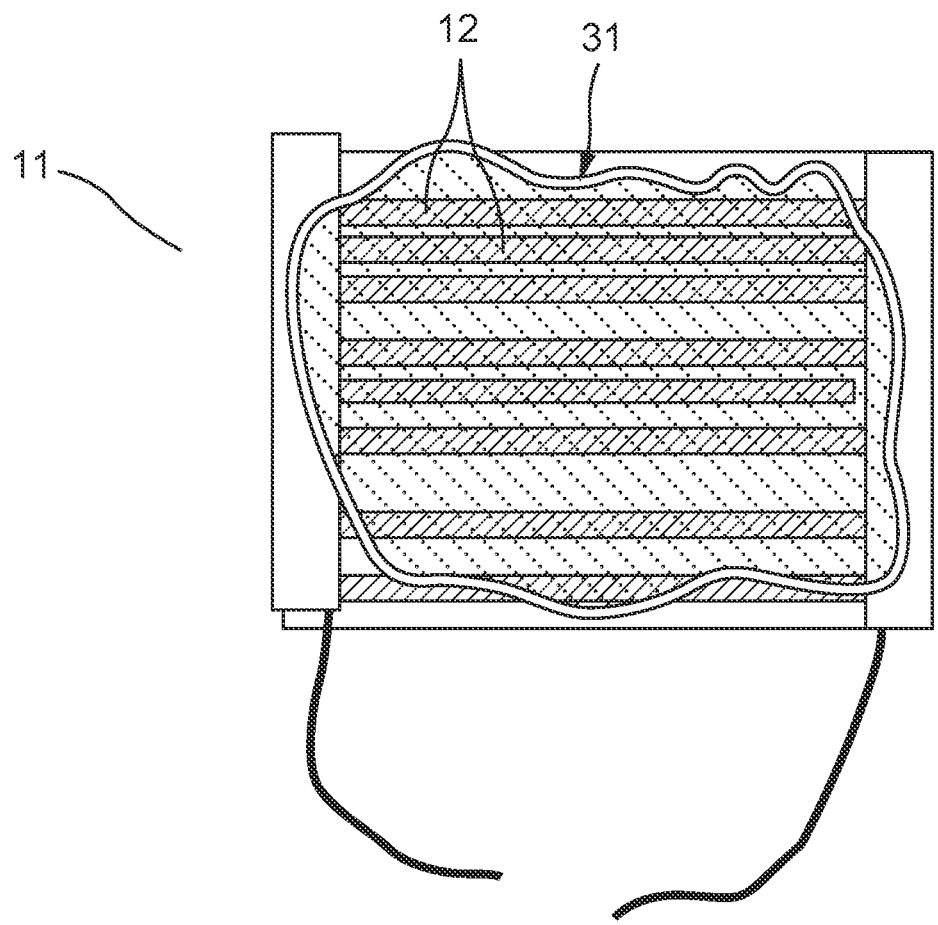
FIG. 3 shows an example of a salt layer deposited on a substrate and patterns of carbon nanostructures, according to aspects of the present disclosure.

FIG. 3 shows an example of a salt layer deposited on the substrate and the patterns of carbon nanostructures. In particular, FIG. 3 shows a substrate 11 having aligned strips of carbon nanostructures 12 deposited thereon, as described in relation to FIG. 1 and FIG. 2. FIG. 3 further shows a salt layer 31 covering a portion of the substrate and the patterns of carbon nanostructures 12. According to some aspects, the salt layer may cover at least about 50% of the surface area of the substrate 11 and/or the patterns of carbon nanostructures 12, optionally at least about 60%, optionally at least about 70%, optionally at least about 80%, optionally at least about 90%, and optionally at least about 100%. It should be understood that the salt layer be provided on the substrate and/or the patterns of carbon nanostructures by any means known in the art compatible with the present disclosure, including, but not limited to, thermal deposition.

Figure 4:
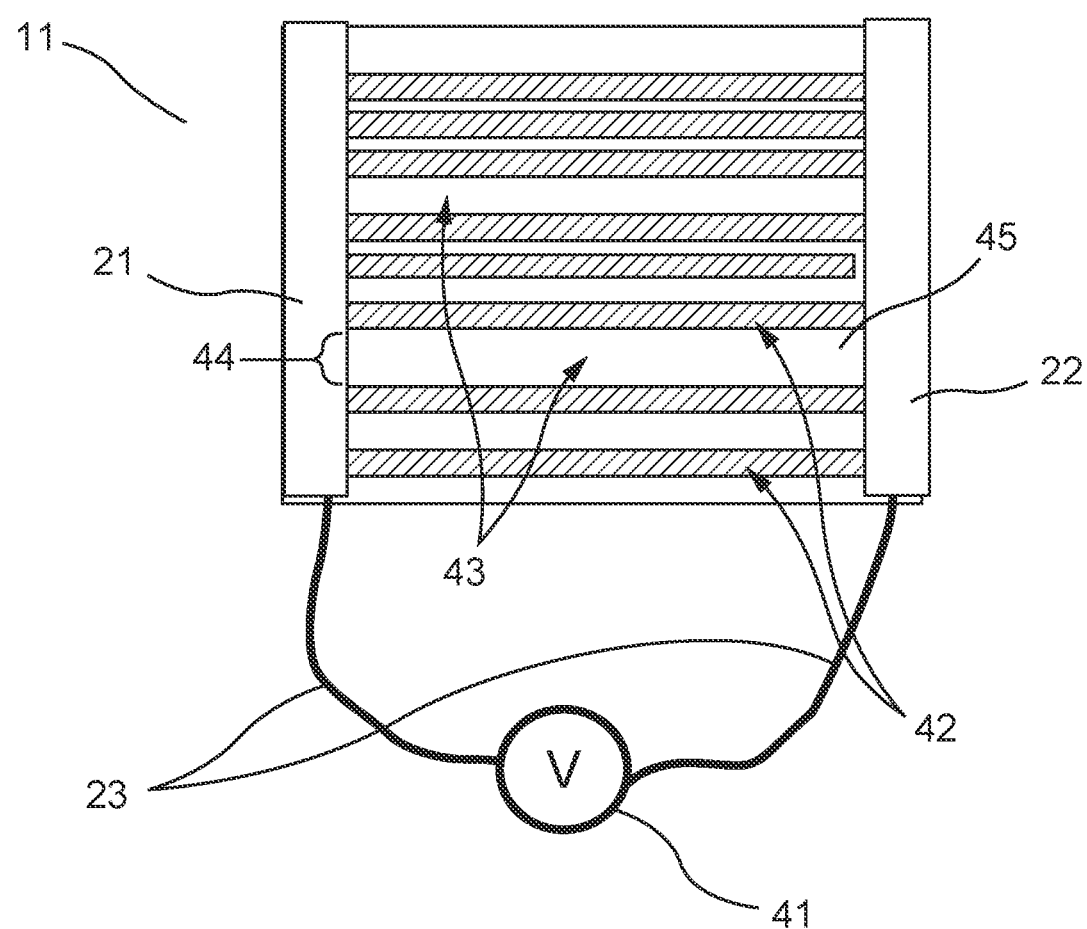
FIG. 4 shows an electrical network, according to aspects of the present disclosure.

The method may comprise resistively heating the patterns of carbon nanostructures to remove the patterns of carbon nanostructures and the portion of the salt layer deposited thereon. As used herein, the term "resistive heating" refers to a process wherein the passage of an electric current through a conductor produces heat. According to some aspects, resistive heating may be performed by forming an electrical network comprised by one or more of the components as described herein. For example, FIG. 4 shows an electrical network formed by a voltage source 41, metal portions 21 and 22, wiring 23, and carbon nanostructures (not shown in FIG. 4), as described herein. As an electric current flows through the electrical network, heat may be generated, which may remove the patterns of carbon nanostructures and the salt deposited thereon (e.g., the patterns of carbon nanostructures 12 and the portion of salt layer 31 deposited thereon as shown in FIG. 3), for example, by etching some or all of the patterns of carbon nanostructures. As used herein, the term "etching" refers to the process of corroding a material. For example, etching carbon nanostructures may comprise oxidation of the carbon nanostructures via resistive heating in the presence of oxygen resulting in corrosion of the carbon nanostructures. In another example, etching carbon nanostructures may comprise decomposition and/or evaporation of the carbon nanostructures in a vacuum or inert atmosphere. According to some aspects, the method may comprise resistively heating the patterns of carbon nanostructures such that complete etching of the carbon nanostructures is achieved, that is, at least about 90% of the patterns of carbon nanostructures is removed, optionally at least about 95%, and optionally at least about 100%.

As shown in FIG. 4, as a result of resistive heating, approximately all of the patterns of carbon nanostructures and the salt deposited thereon (e.g., the patterns of carbon nanostructures 12 and the portion of salt layer 31 deposited thereon as shown in FIG. 3) may be removed. As a result, patterns of the substrate material 42 may be revealed. It should be understood that the patterns of the substrate material 42 correspond to the patterns of carbon nanostructures removed during resistive heating. As shown in FIG. 4, the substrate 11 may also comprise patterns of salt 43 thereon. It should be understood that the patterns of salt 43 correspond to the remaining salt layer 31, as described in relation to FIG. 3, that is, the portion of the salt layer 31 that was not removed during resistive heating. The patterns of salt may thus correspond to the patterns of carbon nanostructures 12 removed during resistive heating, and in particular, may correspond to the area of the substrate 11 that was not covered by the patterns of carbon nanostructures 12 in earlier steps of the method.

It should be understood that in the case wherein the patterns of carbon nanostructures 12 comprised strips, the patterns of salt 43 will comprise strips having a width corresponding to the distance between the patterns of carbon nanostructures 12. For example, FIG. 4 shows a strip of salt 45 having a width 44. This width may correspond to the distance 15 between the first strip 121 and the second strip 122 shown in FIG. 1. As shown in FIG. 4, the patterns of salt 43 may therefore comprise aligned "strips," as described herein, wherein each strip has a pre-determined width. According to some aspects, the width of each salt strip may be no more than about 50 nm, optionally no more than about 25 nm, optionally no more than about 10 nm, optionally no more than about 7 nm, optionally no more than about 5 nm, and optionally no more than about 1 nm.

The method may further comprise growing an atomic layer of metal dichalcogenides on the patterns of salt. Examples of metal dichalcogenides useful according to the present disclosure include, but are not limited to, molybdenum disulfide ($MoS_2$), molybdenum diselenide ($MoSe_2$), tungsten disulfide ($WS_2$), and combinations thereof. The atomic layer of metal dichalcogenides may be grown on the patterns of salt by any means known in the art compatible with the present disclosure. For example, the atomic layer of metal dichalcogenides may be grown on the patterns of salt by thermally co-depositing a metal oxide and a chalcogen onto the patterns of salt. For example, in the case wherein the metal dichalcogenide comprises $MoS_2$, molybdenum dioxide ($MoO_2$) may be thermally co-deposited with sulfur (S) onto the patterns of salt. The metal dichalcogenide may comprise $WS_2$ and/or $MoSe_2$ by using tungsten dioxide ($WO_2$) and/or tungsten trioxide ($WO_3$) as a metal oxide as described herein and/or by using selenium (Se) as a chalcogen as described herein.

According to some aspects, the atomic layer of metal dichalcogenides may be grown on the patterns of salt according to the methods described in U.S. patent application Ser. No. 16/217,845, filed Dec. 12, 2018, the disclosure of which being incorporated herein in its entirety by reference. It should be understood that U.S. patent application Ser. No. 16/217,845 further discloses example materials that may be used to provide at least a portion of the atomic layer of metal dichalcogenides as described herein.

Figure 5:
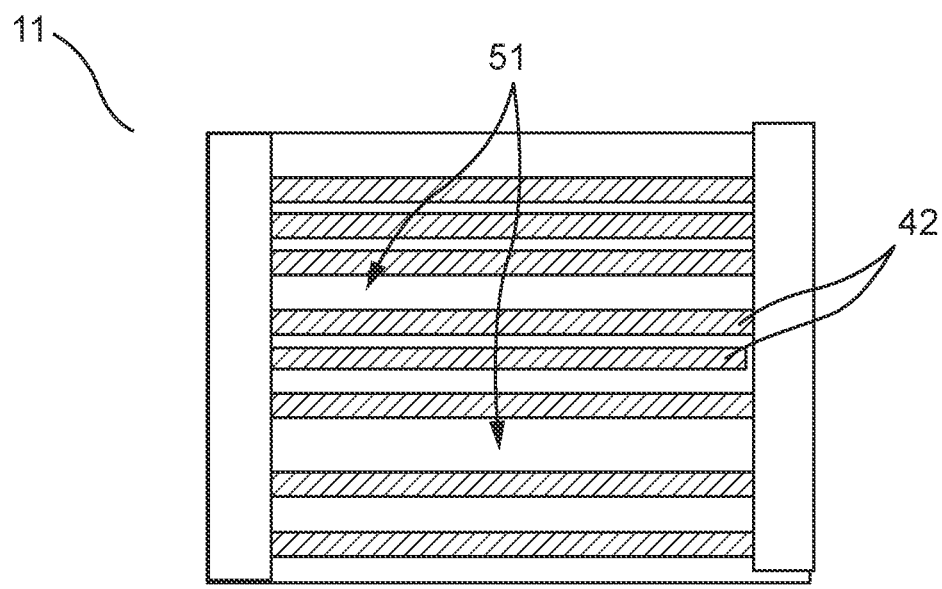
FIG. 5 shows a substrate having patterns of substrate material and patterns of an atomic layer of metal dichalcogenides, according to aspects of the present disclosure.

It should be understood that the patterns of the atomic layer of metal dichalcogenides will correspond with the salt patterns upon which they are grown. For example, FIG. 5 shows the substrate 11 as shown in FIG. 4, that is, the substrate 11 having patterns of the substrate material 42 revealed during resistive heating. FIG. 5 also shows patterns of an atomic layer of metal dichalcogenides 51 grown on the patterns of salt (not shown). The patterns of the atomic layer of metal dichalcogenides 51 may correspond with the patterns of salt 43 as shown in FIG. 4, and in particular, may comprise aligned "strips," as described herein, wherein each strip has a pre-determined width. According to some aspects, the width of each strip may be no more than about 50 nm, optionally no more than about 25 nm, optionally no more than about 10 nm, optionally no more than about 7 nm, optionally no more than about 5 nm, and optionally no more than about 1 nm.

The present disclosure is also directed to patterns of an atomic layer of metal dichalcogenides having a pre-defined width, as described herein. In particular, the patterns of an atomic layer of metal dichalcogenides may comprise ribbons of $MoS_2$, $MoSe_2$, $WS_2$, or a combination thereof, wherein each ribbons has a width of no more than about 50 nm, optionally no more than about 25 nm, optionally no more than about 10 nm, optionally no more than about 7 nm, optionally no more than about 5 nm, and optionally no more than about 1 nm. The present disclosure is also directed to circuits comprising the patterns of the atomic layer of metal dichalcogenides as described herein.

As used herein, the term "about" is defined to being close to as understood by one of ordinary skill in the art. In one non-limiting embodiment, the term "about" is defined to be within 10%, preferably within 5%, more preferably within 1%, and most preferably within 0.5%.

This written description uses examples to disclose the invention, including the preferred embodiments, and also to enable any person skilled in the art to practice the invention, including making and using any devices or systems and performing any incorporated methods. The patentable scope of the invention is defined by the claims, and may include other examples that occur to those skilled in the art. Such other examples are intended to be within the scope of the claims if they have structural elements that do not differ from the literal language of the claims, or if they include equivalent structural elements with insubstantial differences from the literal language of the claims. Aspects from the various embodiments described, as well as other known equivalents for each such aspect, can be mixed and matched by one of ordinary skill in the art to construct additional embodiments and techniques in accordance with principles of this application.

While the aspects described herein have been described in conjunction with the example aspects outlined above, various alternatives, modifications, variations, improvements, and/or substantial equivalents, whether known or that are or may be presently unforeseen, may become apparent to those having at least ordinary skill in the art. Accordingly, the example aspects, as set forth above, are intended to be illustrative, not limiting. Various changes may be made without departing from the spirit and scope of the disclosure. Therefore, the disclosure is intended to embrace all known or later-developed alternatives, modifications, variations, improvements, and/or substantial equivalents.

Reference to an element in the singular is not intended to mean "one and only one" unless specifically so stated, but rather "one or more." All structural and functional equivalents to the elements of the various aspects described throughout this disclosure that are known or later come to be known to those of ordinary skill in the art are expressly incorporated herein by reference. Moreover, nothing disclosed herein is intended to be dedicated to the public.

Further, the word "example" is used herein to mean "serving as an example, instance, or illustration." Any aspect described herein as "example" is not necessarily to be construed as preferred or advantageous over other aspects. Unless specifically stated otherwise, the term "some" refers to one or more. Combinations such as "at least one of A, B, or C," "at least one of A, B, and C," and "A, B, C, or any combination thereof" include any combination of A, B, and/or C, and may include multiples of A, multiples of B, or multiples of C. Specifically, combinations such as "at least one of A, B, or C," "at least one of A, B, and C," and "A, B, C, or any combination thereof" may be A only, B only, C only, A and B, A and C, B and C, or A and B and C, where any such combinations may contain one or more member or members of A, B, or C.

Moreover, all references throughout this application, for example patent documents including issued or granted patents or equivalents; patent application publications; and non-patent literature documents or other source material; are hereby incorporated by reference herein in their entireties, as though individually incorporated by reference.

What is claimed is:

1. A method of growing patterns of an atomic layer of metal dichalcogenides, the method comprising:
   providing a substrate;
   providing aligned patterns of carbon nanostructures on the substrate;
   providing a first metal portion in contact with a first portion of the patterns of carbon nanostructures and a second metal portion in contact with a second portion of the patterns of carbon nanostructures;
   depositing a salt layer on the substrate and the patterns of carbon nanostructures;
   resistively heating the patterns of carbon nanostructures to remove the patterns of carbon nanostructures and salt deposited thereon from the substrate, wherein removing the patterns of carbon nanostructures and salt deposited thereon from the substrate provides salt patterns on the substrate; and
   growing an atomic layer of metal dichalcogenides on the salt patterns
   wherein the atomic layer of metal dichalcogenides is provided in aligned patterns each having a pre-defined width.

2. The method according to claim 1, wherein the substrate comprises $SiO_2$.

3. The method according to claim 1, wherein the patterns of carbon nanostructures comprise strips of carbon nanostructures.

4. The method according to claim 1, wherein the carbon nanostructures comprise carbon nanotubes.

5. The method according to claim 1, wherein the first metal portion and/or the second metal portion comprises a metal selected from the group consisting of Ti, Cu, Au, and combinations thereof.

6. The method according to claim 1, wherein the salt layer comprises NaBr.

7. The method according to claim 1, wherein resistively heating the patterns of carbon nanostructures to remove the patterns of carbon nanostructures and salt deposited thereon from the substrate comprises:
   providing an electrical network formed from a voltage source, the first metal portion, the second metal portion, a metal wiring, and the patterns of carbon nanostructures; and
   flowing an electric current through the electrical network to etch at least a portion of the patterns of carbon nanostructures.

8. The method according to claim 7, wherein about 100% of the patterns of carbon nanostructures and salt deposited thereon is removed from the substrate via resistive heating.

9. The method according to claim 7, wherein the metal wiring comprises a metal selected from the group consisting of Ti, Cu, Au, and combinations thereof.

10. The method according to claim 1, wherein the salt patterns comprise salt strips.

11. The method according to claim 10, wherein each of the salt strips has a width of no more than about 5 nm.

12. The method according to claim 1, wherein growing the atomic layer of metal dichalcogenides on the salt patterns comprises thermally co-depositing a metal oxide and a chalcogen onto the salt patterns.

13. The method according to claim 12, wherein the metal oxide is selected from the group consisting of tungsten dioxide, tungsten trioxide, molybdenum dioxide, and combinations thereof, and
the chalcogen is selected from the group consisting of selenium, sulfur, and a combination thereof.

14. The method according to claim 13, wherein the atomic layer of metal dichalcogenides comprises molybdenum disulfide.

15. The method according to claim 1, wherein the predefined width is no more than about 5 nm.

16. The method according to claim 1, wherein the aligned patterns of the atomic layer of metal dichalcogenides comprise ribbons of the atomic layer of metal dichalcogenides.

17. A method of patterned growth of metal dichalcogenides, the method comprising:
providing a substrate including a first end and a second end, and a plurality of carbon nanotubes that define patterns extending between the first end and the second end that partially cover the substrate;
depositing a salt layer on the substrate;
removing the patterns from the substrate to form alternating strips of exposed substrate and strips of salt-coated substrate that extend between the first end and the second end; and
growing a layer of metal dichalcogenides on the strips of salt-coated substrate.

18. The method of claim 17, wherein the step of removing the patterns from the substrate comprises applying an electric current to the carbon nanotubes.

19. The method of claim 17, wherein the step of providing a substrate comprises:
depositing a catalyst or catalyst precursor on the substrate adjacent the first end;
introducing a carbon source; and
growing carbon nanotubes to form the patterns.

20. The method of claim 19, wherein the step of providing a substrate comprises:
depositing a first metal portion adjacent the first end of the substrate in contact with a first portion of the carbon nanotube patterns and depositing a second metal portion adjacent the second end of the substrate in contact with a second portion of the carbon nanotube patterns, and wherein the step of removing the patterns from the substrate comprises applying an electric current to the carbon nanotubes.

* * * * *